(12) United States Patent
Nakai

(10) Patent No.: US 7,859,446 B2
(45) Date of Patent: Dec. 28, 2010

(54) AD CONVERTER AND AD CONVERSION METHOD

(75) Inventor: Hiroshi Nakai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 3 days.

(21) Appl. No.: 12/457,572

(22) Filed: Jun. 16, 2009

(65) Prior Publication Data

US 2010/0013684 A1    Jan. 21, 2010

(30) Foreign Application Priority Data

Jul. 17, 2008    (JP) .............................. 2008-185524

(51) Int. Cl.
    *H03M 1/36*    (2006.01)
(52) U.S. Cl. ...................... 341/159; 341/155
(58) Field of Classification Search ................ 341/155, 341/161, 163, 156, 118, 120, 159
    See application file for complete search history.

(56) References Cited

U.S. PATENT DOCUMENTS

| 4,535,319 A | * | 8/1985 | Penney ....................... 341/156 |
| 4,750,180 A | * | 6/1988 | Doyle ......................... 714/762 |
| 5,736,948 A | * | 4/1998 | Mitsuishi et al. ............ 341/141 |
| 6,014,096 A | * | 1/2000 | Nakagawa et al. ............ 341/68 |
| 6,163,291 A | * | 12/2000 | Uchino et al. ............... 341/163 |
| 2004/0153945 A1 | * | 8/2004 | Takami ....................... 714/758 |

FOREIGN PATENT DOCUMENTS

JP    5-335953    12/1993

* cited by examiner

*Primary Examiner*—Peguy JeanPierre
(74) *Attorney, Agent, or Firm*—Foley & Lardner LLP

(57) ABSTRACT

An exemplary object of the present invention is to achieve both of high-speed operation by parallel processing and a simple configuration by sequential comparison processing, so as to realize high accuracy of AD conversion processing. An AD converter according to the present invention includes a parallel-type AD converting unit that generates an upper bit digital signal composed of a plurality of bits by parallel processing based on an input analog signal input from a predetermined input circuit, a sequential comparison type AD converting unit that generates a digital signal by sequential comparison processing based on a converted analog signal that is generated by converting the upper bit digital signal into an analog signal, and a reconversion controller that detects an indefinite bit included in the upper bit digital signal and reconverts the indefinite bit by the sequential comparison type AD converting unit.

10 Claims, 6 Drawing Sheets

Fig. 4A
```
              x
              ↓
    d   : 1 0 1 0 0 0 0 0
  d-1 : 1 0 0 1 1 1 1 1
  d+1 : 1 0 1 0 0 0 0 1
```
Fig. 4B
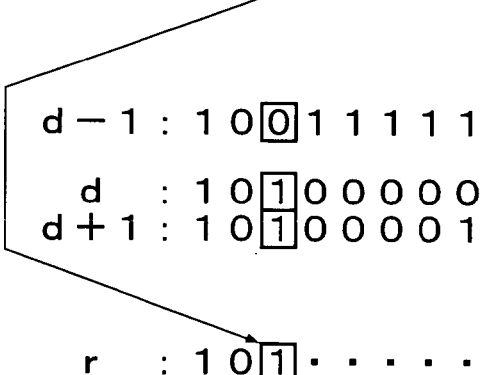
Fig. 4C
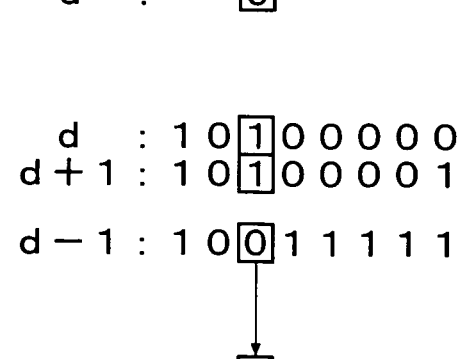

AD CONVERTER AND AD CONVERSION METHOD

BACKGROUND

1. Field of the Invention

The present invention relates to an AD converter and an AD conversion method to convert an analog signal such as a voltage to a digital signal, and more particularly, to a correction processing.

2. Description of Related Art

With recent advancement of computer systems, high-speed operation and high accuracy are required in AD converters. One of AD conversion methods includes parallel (flash) processing, where an input analog signal is compared with a reference voltage at one time with multiple comparators arranged in parallel. This parallel processing is suitable for high-speed processing. In order to accomplish high accuracy (high-resolution ability) with this parallel processing, the number of comparators or resistance elements of a ladder circuit generating a reference voltage is increased, for example. This method, however, increases size of the circuit.

Other AD conversion methods include sequential comparison processing, where an input analog signal and a reference voltage are repeatedly compared by one comparator. According to this processing, it is possible to accomplish high accuracy with a simple circuit configuration by increasing the number of times of comparison. However, as the number of times of comparison is increased, high-speed operation cannot be achieved.

As stated above, each of the parallel processing and the sequential comparison processing has advantages and disadvantages. A related art (Japanese Unexamined Patent Application Publication No. 5-335953) is disclosed for realizing high-speed operation and high accuracy of the AD conversion processing in consideration of these advantages and disadvantages. This related art generates upper eight bits of the digital signal by parallel processing where high-speed operation is possible, and generates lower two bits to correct the error of the least significant bit of this upper eight bits by sequential comparison processing that uses fewer elements.

However, according to the technique disclosed in the above-described Japanese Unexamined Patent Application Publication No. 5-335953, when the sequential comparison processing is carried out, reconversion is performed using a signal having a least significant bit of "1" regardless of the value of the least significant bit of the upper eight bits. As such, it is impossible to correct the error when the upper bit is carried up or moved down due to the error of the least significant bit.

SUMMARY

A first exemplary aspect of an embodiment of the present invention is an AD converter including a parallel-type AD converting unit that generates an upper bit digital signal composed of a plurality of bits by parallel processing based on an input analog signal input from a predetermined input circuit, a sequential comparison type AD converting unit that generates a digital signal by sequential comparison processing based on a converted analog signal that is generated by converting the upper bit digital signal into an analog signal, and a reconversion controller that detects an indefinite bit included in the upper bit digital signal and reconverts the indefinite bit by the sequential comparison type AD converting unit.

A second exemplary aspect of an embodiment of the present invention is an AD conversion method including generating an upper bit digital signal composed of a plurality of bits by parallel processing based on an input analog signal input from a predetermined input circuit, generating a digital signal by sequential comparison processing based on a converted analog signal that is generated by converting the upper bit digital signal into an analog signal, detecting an indefinite bit included in the upper bit digital signal, and reconverting the indefinite bit by the sequential comparison processing.

According to the device and the method as described above, the upper bit digital signal is firstly generated by the parallel processing, followed by detection of the indefinite bit included in the upper bit digital signal. Then, reconversion by sequential comparison processing is performed on the indefinite bit. This indefinite bit is detected based on presence or absence of capability of including the error for all the bits from the least significant bit to the most significant bit of the upper bit digital signal.

One of the effects according to the present invention is to achieve both of high-speed operation by parallel processing and a simple configuration by sequential comparison processing, so as to realize high accuracy of AD conversion processing.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 4A is a diagram showing an example of an upper eight-bit digital signal d, and comparison digit strings (d−1) and (d+1) according to the first exemplary embodiment of the present invention;

FIG. 4B is a diagram showing an example of an upper eight-bit digital signal d, comparison digit strings (d−1) and (d+1), a reconversion signal d', and a definite digital signal r according to the first exemplary embodiment of the present invention;

FIG. 4C is a diagram showing an example of an upper eight-bit digital signal d, comparison digit strings (d−1) and (d+1), a reconversion signal d', and a definite digital signal r according to the first exemplary embodiment of the present invention;

FIG. 6A is a diagram showing an example of an upper eight-bit digital signal d, and comparison digit strings (d−2), (d−1), (d+1), and (d+2) according to the second exemplary embodiment of the present invention; and FIG. 6B is a diagram showing an example of an upper eight-bit digital signal d, comparison digit strings (d−2), (d−1), (d+1), (d+2), a reconversion signal d', and a definite digital signal r according to the second exemplary embodiment of the present invention.

DETAILED DESCRIPTION OF THE EXEMPLARY EMBODIMENTS

First Exemplary Embodiment

Figure 1:
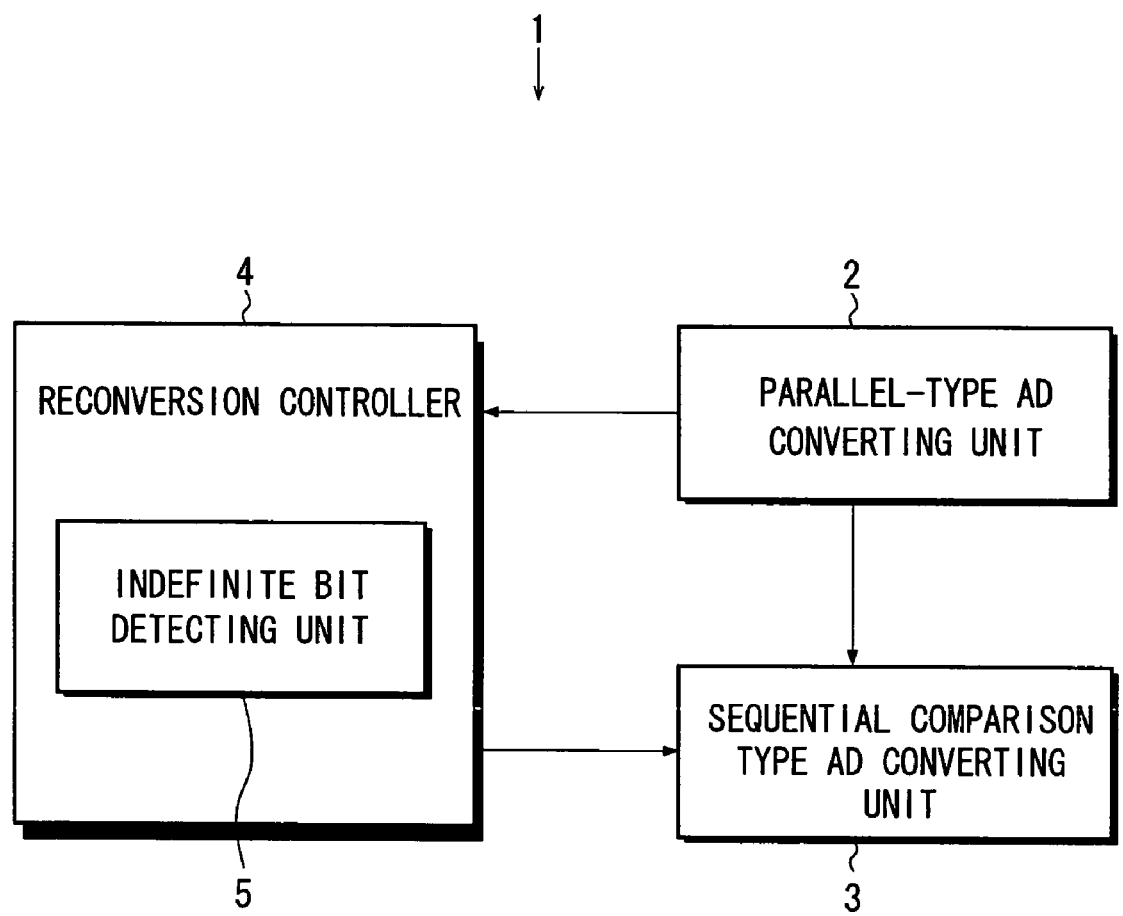
FIG. 1 shows the basic configuration of an AD converter according to the present invention.

The exemplary embodiments of the present invention will be described with reference to the accompanying drawings. FIG. 1 shows the basic configuration of an AD converter 1 according to the present invention. The AD converter 1 includes a parallel-type AD converting unit 2, a sequential comparison type AD converting unit 3, and a reconversion controller 4.

The parallel-type AD converting unit 2 generates an upper bit digital signal composed of a plurality of bits by parallel processing based on an input analog signal input from a predetermined input circuit.

The sequential comparison type AD converting unit 3 generates a digital signal by sequential comparison processing based on a converted analog signal generated by converting the upper bit digital signal to an analog signal.

The reconversion controller 4 detects an indefinite bit included in the upper bit digital signal, and reconverts the indefinite bit by the sequential comparison type AD converting unit 3.

According to the AD converter 1, the upper bit digital signal is firstly generated by the parallel processing, followed by detection of the indefinite bit included in the upper bit digital signal. Then, reconversion by the sequential comparison processing is performed on the indefinite bit. This indefinite bit is detected based on presence or absence of capability of including the error for all the bits from the least significant bit to the most significant bit of the upper bit digital signal. Accordingly, it is possible to achieve both of high-speed operation by parallel processing and a simple configuration by sequential comparison processing, so as to realize high accuracy of AD conversion processing.

Further, the reconversion controller 4 preferably includes an indefinite bit detecting unit 5 that sets a comparison digit string based on the upper bit digital signal and compares the upper bit digital signal with the comparison digit string for each bit, so as to detect the indefinite bit.

Figure 2:
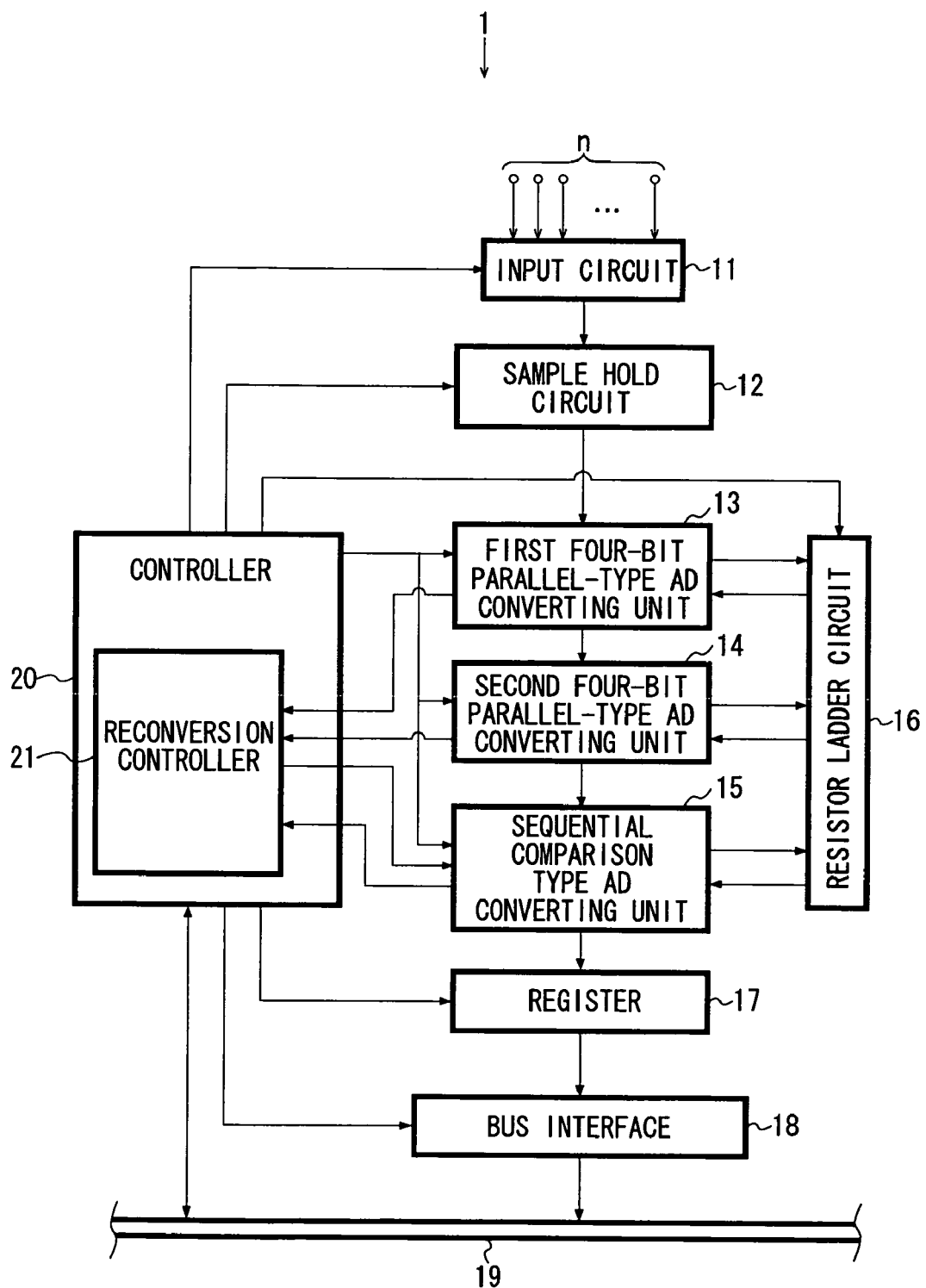
FIG. 2 shows the configuration of the AD converter according to a first exemplary embodiment of the present invention.

Now, the specific configuration example of the AD converter 1 will be shown below. FIG. 2 shows the configuration of the AD converter 1 according to the first exemplary embodiment of the present invention. This AD converter 1 includes an input circuit 11, a sample hold circuit 12, a first four-bit parallel-type AD converting unit 13, a second four-bit parallel-type AD converting unit 14, a sequential comparison type AD converting unit 15, a resistor ladder circuit 16, a register 17, a bus interface 18, a bus 19, a controller 20, and a reconversion controller 21.

The input circuit 11 selectively receives a plurality of analog signals such as voltage that are transmitted from a predetermined sensor. For example, the input circuit is formed of a low-pass filter, a multiplexer or the like. In the present invention, any known device may be applied as appropriate.

The sample hold circuit 12 holds the analog signal input from the input circuit 11 for a certain period of time. For example, the sample hold circuit 12 is composed of an analog switch, a capacitor or the like. In the present invention, any known device may be applied as appropriate.

The first four-bit parallel-type AD converting unit 13 compares a voltage held in the sample hold circuit 12 with a reference voltage supplied from the resistor ladder circuit 16 described later, and generates a four-bit digital signal by known parallel processing. The digital signal that is obtained here allocates the analog signal (voltage value) to one stage obtained by dividing an adjustable width of the reference voltage of the resistor ladder circuit 16 into 16 stages.

The second four-bit parallel-type AD converting unit 14 compares a voltage of the analog signal with a reference voltage supplied from the resistor ladder circuit 16, and generates a four-bit digital signal by known parallel processing. The digital signal that is obtained here allocates the analog signal (voltage value) to one stage obtained by further dividing one stage allocated by the first four-bit parallel-type AD converting unit 13 into 16 stages.

The signal obtained by the first four-bit parallel-type AD converting unit 13 is upper four bits, and the signal obtained by the second four-bit parallel-type AD converting unit 14 is middle four bits. The upper eight-bit digital signal can be thus obtained. The processing for generating the upper eight-bit digital signal is performed with high speed by known parallel processing. Note that, in the present invention, the configuration of the upper eight-bit digital signal is not limited to the one described above.

The sequential comparison type AD converting unit 15 compares a voltage of an analog signal that is obtained by converting the upper eight-bit digital signal to an analog signal with a reference voltage of the resistor ladder circuit 16, and generates a digital signal by known sequential comparison processing. Then, reconversion processing is performed on the bit that corresponds to an indefinite bit described later among the bits that compose the upper eight-bit digital signal. Further, the sequential comparison type AD converting unit 15 may correct one LSB and generate a digital signal of lower two bits for the upper eight-bit digital signal, as shown in Japanese Unexamined Patent Application Publication No. 5-335953.

The resistor ladder circuit 16 supplies the reference voltage to the first and second four-bit parallel-type AD converting units 13 and 14 and the sequential comparison type AD converting unit 15. For example, the resistor ladder circuit 16 is formed of a tap decoder, or a plurality of resistors connected on a ladder, for example. Any known device may be used as the resistor ladder circuit 16 in the present invention.

The register 17 is a known storage device that enables high-speed processing.

The bus interface 18 is a known one that enables transmission and reception of signals through the bus 19 between the register and a CPU or the like.

The controller 20 controls the above-described components 11 to 18, and is formed by collaboration of a CPU, a RAM, a ROM, a predetermined program or the like. For example, the controller 20 supplies a clock signal to each of the AD converting units 13, 14, 15, or supplies a selection signal to the tap decoder in the resistor ladder circuit 16 upon receiving the conversion result by the first four-bit parallel-type AD converting unit 13.

Further, the controller 20 includes a reconversion controller 21. The reconversion controller 21 performs reconversion processing as a correction sequence by the sequential comparison type AD converting unit 15 on the upper eight-bit digital signal obtained by the first and second four-bit parallel-type AD converting units 13, 14. In this reconversion processing, the comparison digit string is set based on the upper eight-bit digital signal, the upper eight-bit digital signal is compared with the comparison digit string for each bit, the indefinite bit is detected based on the comparing result, and the reconversion processing is executed on this indefinite bit by the sequential comparison type AD converting unit 15. The comparison digit string is set by subtracting the predetermined compared correction value from the upper eight-bit digital signal or by adding the predetermined compared correction value to the upper eight-bit digital signal. In the first exemplary embodiment, the compared correction value is set to 1.

Figure 3:
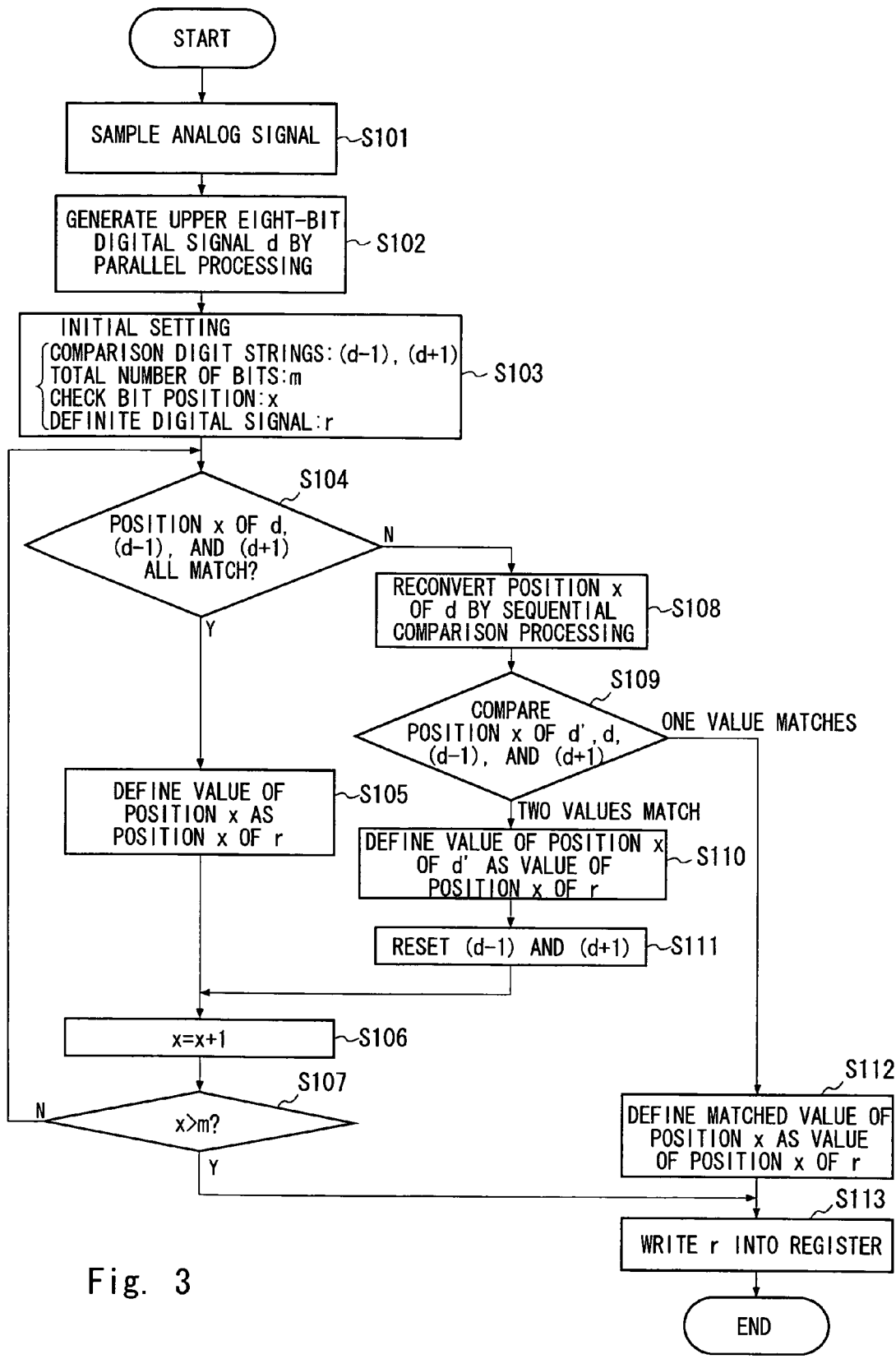
FIG. 3 is a flow chart showing a flow of a reconversion processing according to the first exemplary embodiment of the present invention.

Referring now to FIG. 3, the reconversion processing will be described. When the analog signal input from the input circuit 11 is sampled by the sample hold circuit 12 (S101), the upper eight-bit digital signal d is generated by the first and second four-bit parallel-type AD converting units 13 and 14 (parallel processing) based on this analog signal (voltage value) (S102).

Then, the two comparison digit strings (d−1), (d+1), a total number of bits m, a check bit position x, and a definite digital signal r are set based on the upper eight-bit digital signal d. The number "1" in the comparison digit strings (d−1), (d+1) indicates the compared correction value. In FIGS. 4A, 4B, and 4C, an example of the upper eight-bit digital signal d, the comparison digit strings (d−1), (d+1), a reconversion signal d', and a definite digital signal r are shown. As shown in FIG. 4A, when the upper eight-bit digital signal d is "10100000", one comparison digit string (d−1) is "10011111" and the other comparison digit string (d+1) is "10100001". In summary, (d−1) and (d+1) are obtained by subtracting the compared correction value 1 from d or by adding the compared correction value 1 to d based on binary. The total number of bits m is eight in this example. As the check bit position x, 1 is set that indicates the most significant bit position in the initial stage. This x will be described below, and x is moved to lower-side bits (2, 3, . . . ) every time the check of the bit (1) is completed in a process flow. As the definite digital signal r, 0 is set in the initial stage.

In step S104 (see FIG. 3), the value of the position x of the upper eight-bit digital signal d is compared with the values of the position x of the comparison digit strings (d−1), (d+1), so as to judge whether all the values match with each other. More specifically, as shown in FIG. 4A, when x=3, the value of comparison target is "1" for d, "0" for (d−1), and "1" for (d+1), and the judgment in step S104 is "N". Further, when x=1 and 2, the judgment in step S104 is "Y". When it is judged as "Y" in step S104, the matched value is defined in the position x of the definite digital signal r (S105). Then, x is moved to a lower-bit side (S106), and it is judged whether x is larger than the total number of bits m (S107). When it is judged as "N" in step S107, the step S104 is performed again.

On the other hand, if it is judged as "N" in the step S104, which means if at least one of the three values of the position x is different, the position x of the upper eight-bit digital signal d is reconverted by the sequential comparison type AD converting unit 15 (sequential comparison processing) in step S108 to obtain a reconversion signal d'. Then, the values of the position x of d', d, (d−1), (d+1) are compared (S109). FIG. 4B shows a case in which the value of the position x of d' is "1" by the processing of the step S108, which is a case in which the value of d' is equal to d. In such a case, the values of the position x of (d+1) and d are both "1", and thus, it is judged as "two values match" in the step S109. Then, in step S110, the value "1" of the position x of d' is defined as the value of r, followed by reset of (d−1) and (d+1) (S111), and the step moves to the step S106.

Further, FIG. 4C shows a case in which the value of the position x of d' becomes "0" by the processing of the step S108. In such a case, only (d−1) matches, and thus, it is judged in the step S109 as "one value matches". Then, in step S112, the value of the position x of (d−1) that matches d' is defined as the value of r. Then, the defined r is written in the register 17 (S113).

As described above, the AD converter 1 according to the first exemplary embodiment sets the comparison digit strings (d−1), (d+1) by subtracting or adding the compared correction value based on the upper eight-bit digital signal d obtained by the parallel conversion processing in high speed and compares the values of the check bit position x of d, (d−1), and (d+1). Then, the indefinite bit is detected based on the comparing result, and the sequential comparison processing is performed on the indefinite bit. According to the indefinite bit, it is possible to detect carrying up or moving down of the upper bit that is occurred when the least significant bit is different from the original value due to the error of the comparator or the like. The related art (Japanese Unexamined Patent Application Publication No. 5-335953, for example) cannot deal with the error due to the carrying up or moving down. According to the present invention, the sequential comparison processing is executed on such an indefinite bit, to thereby enable to realize the AD conversion processing having high accuracy.

Second Exemplary Embodiment

Figure 5:
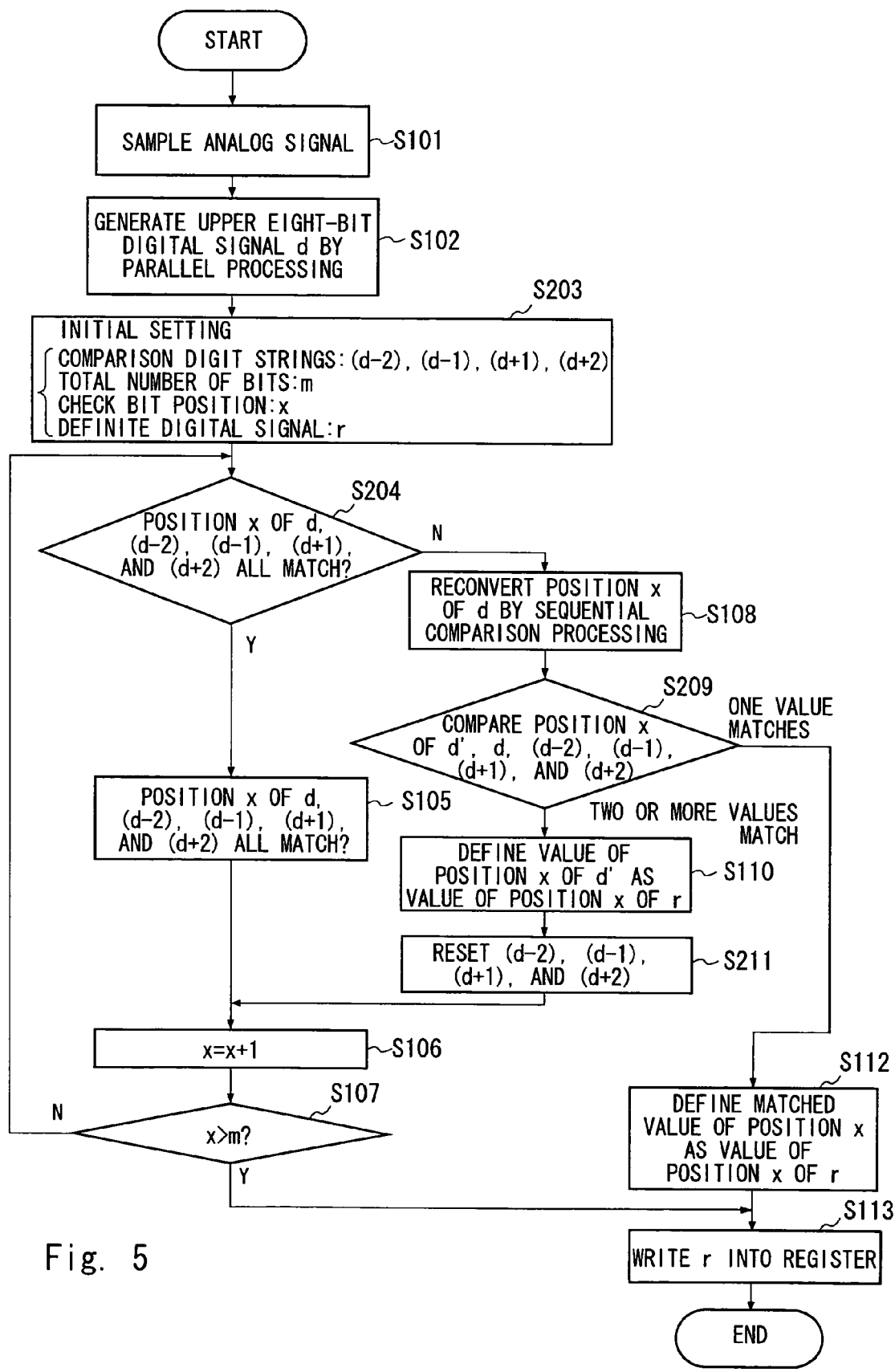
FIG. 5 is a flow chart showing a flow of a reconversion processing according to a second exemplary embodiment of the present invention.

In FIGS. 5, 6A, and 6B, the reconversion processing by the reconversion controller 21 according to the second exemplary embodiment is shown. Note that the explanation regarding the same or similar effect as that of the first exemplary embodiment will be omitted. In the second exemplary embodiment, the compared correction value that is used in setting the comparison digit string is set to two. In this case, as shown in FIG. 6A, when the upper eight-bit digital signal d is "10100000", the comparison digit string (d−2) is "10011110", (d−1) is "10011111", (d+1) is "10100001", and (d+2) is "10100010". As such, a total of four comparison digit strings including two comparison digit strings in the subtracting side and two comparison digit strings in the adding side are set in the second exemplary embodiment. In short, when the compared correction value is any integer k (k>0), 2*k comparison digit strings are set.

In the second exemplary embodiment, as shown in steps S203 and S204 in FIG. 5, the four comparison digit strings (d−2), (d−1), (d+1), (d+2) are set in the initial state, and it is judged whether the values of the check bit position x of the upper eight-bit digital signal d and the comparison digit strings (d−2), (d−1), (d+1), (d+2) all match. If it is judged as "N" in step S204, which means if at least one of the five values of the position x is different, the position x of the upper eight-bit digital signal d is reconverted by the sequential comparison type AD converting unit 15 (sequential comparison processing) in the step S108, so as to obtain the reconversion signal d'.

Then, in step S209, the values of the position x of d', d, (d−2), (d−1), (d+1), and (d+2) are compared. FIG. 6B shows an example in which the reconversion signal d' is "0". In this case, as (d−2) and (d−2) match, it is judged as "two or more values match" in step S209. Then, in the step S110, the value of d' is defined as the value of the position x of the definite digital signal r. On the other hand, if it is judged as "one value matches" in the step S209, the matched value of the position x is defined as the value of the definite digital signal r in the step S112.

As described above, by making the compared correction value larger, the accuracy can further be improved.

An exemplary advantage according to the above-described embodiments is to achieve both of high-speed operation by the parallel processing and a simple configuration by the sequential comparison processing, so as to realize high accuracy of the AD conversion processing.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An AD converter comprising:
    a parallel-type AD converting unit that generates an upper bit digital signal composed of a plurality of bits by parallel processing based on an input analog signal input from a predetermined input circuit;
    a sequential comparison type AD converting unit that generates a digital signal by sequential comparison processing based on a converted analog signal that is generated by converting the upper bit digital signal into an analog signal; and
    a reconversion controller that detects an indefinite bit included in the upper bit digital signal and reconverts the indefinite bit by the sequential comparison type AD converting unit.

2. The AD converter according to claim 1, wherein the reconversion controller comprises an indefinite bit detecting unit that sets a comparison digit string based on the upper bit digital signal and compares the upper bit digital signal with the comparison digit string for each bit, so as to detect the indefinite bit.

3. The AD converter according to claim 2, wherein the indefinite bit detecting unit judges a bit position as the indefinite bit when at least one of a plurality of values of the upper bit digital signal and the comparison digit string that correspond to the same bit position is different.

4. The AD converter according to claim 2, wherein the comparison digit string is set by subtracting a compared correction value composed of any integer from the upper bit digital signal or by adding the compared correction value to the upper bit digital signal.

5. The AD converter according to claim 4, wherein the compared correction value is 1.

6. An AD conversion method comprising:
    generating an upper bit digital signal composed of a plurality of bits by parallel processing based on an input analog signal input from a predetermined input circuit;
    generating a digital signal by sequential comparison processing based on a converted analog signal that is generated by converting the upper bit digital signal into an analog signal;
    detecting an indefinite bit included in the upper bit digital signal; and
    reconverting the indefinite bit by the sequential comparison processing.

7. The AD conversion method according to claim 6, further comprising
    setting a comparison digit string based on the upper bit digital signal and comparing the upper bit digital signal with the comparison digit string for each bit.

8. The AD conversion method according to claim 7, further comprising
    judging whether a plurality of values of the upper bit digital signal and the comparison digit string that correspond to the same bit position match, and judging the bit position as the indefinite bit when at least one of the values is different.

9. The AD conversion method according to claim 7, further comprising setting the comparison digit string by subtracting a compared correction value composed of any integer from the upper bit digital signal or by adding the compared correction value to the upper bit digital signal.

10. The AD conversion method according to claim 9, wherein the compared correction value is 1.

* * * * *